United States Patent
Lu et al.

(10) Patent No.: US 6,217,640 B1
(45) Date of Patent: Apr. 17, 2001

(54) EXHAUST GAS TREATMENT APPARATUS

(75) Inventors: Tsung-Lin Lu, TaiNan; Jing-Yi Huang, Taipei; Ping-Chung Chung, Hsinchu; Frank Chung, MiaoLi, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/370,486

(22) Filed: Aug. 9, 1999

(51) Int. Cl.$^7$ .................................................. B01D 47/06
(52) U.S. Cl. ................. 96/243; 55/423; 96/273; 96/322
(58) Field of Search ............................ 95/149, 224, 227; 96/243, 267, 270, 273, 322, 355, 361; 55/423, 424, 425

(56) References Cited

U.S. PATENT DOCUMENTS

| | | | |
|---|---|---|---|
| 5,716,428 | * 2/1998 | Imamura | 95/227 |
| 5,855,822 | * 1/1999 | Chen | 96/243 |
| 5,972,078 | * 10/1999 | Collins et al. | 95/224 |
| 6,090,183 | * 7/2000 | Awaji | 55/320 |

* cited by examiner

Primary Examiner—Duane S. Smith

(57) ABSTRACT

An exhaust gas treatment apparatus for treating exhaust gases generated in semiconductor manufacturing processes. It includes a main pipe, a U pipe, a discharge pipe and a tank. The main pipe has an inlet to receive exhaust gases, a heater surrounding the main pipe to heat the exhaust gases to form exhaust gas powder, a sprinkler to spray cooling water to cool the heated exhaust gases to form vapor and waste water and an outlet to discharge vapor and waste water into the U pipe. The U pipe has a first connector connecting with the main pipe and a second connector connecting with the discharging pipe. The tank is located below the U pipe under the first connector for receiving lump type exhaust gas powder scrapping from the inside wall of the main pipe. The U pipe will not be blocked by the lump type exhaust gas powder so that exhaust gas treatment efficiency won't be harmfully affected.

13 Claims, 2 Drawing Sheets

EXHAUST GAS TREATMENT APPARATUS

BACKGROUND OF THE INVENTION

1. Filed of the Invention

This invention relates to an exhaust gas treatment apparatus and particularly to an exhaust gas treatment apparatus for diffusion and deposition processes.

2. Description of the Prior Art

In semiconductor manufacturing process, a bare wafer has to go through hundreds of processes to be equipped with the desired function. The processes include microphotography, diffusion, deposition (particularly chemical vapor deposition, or CVD), etching and the like. These processes mostly require large amount of reaction gases, especially in the diffusion and deposition processes. While a small portion of the gases have reaction with the wafer, a great portion of the gases do not react with the wafer and become exhaust gases. The exhaust gases mainly include SiH4, SiH2Cl2, NF3, etc. They are highly toxic and should be properly treated to remove the toxicity to comply with industry standards before being discharged out.

In semiconductor industry nowadays, a commonly used treatment method for these toxic exhaust gases such as SiH4, SiH2Cl2, NF3 is to heat the exhaust gases to about 800° C. and to mix with oxygen gas at high temperature to form powders of SiO2 compounds. The high temperature compounds then mix with cooling water to form vapor and waste water for discharging. An exhaust gas treatment apparatus usually has to be equipped with the function set forth above to handle the exhaust gases generated in the diffusion and deposition processes.

FIG. 1 illustrates a conventional exhaust gas treatment apparatus 10 which includes a main pipe 12, an U pipe 14 and a discharge pipe 16.

The main pipe 12 includes an inlet 121 at an upper end thereof, an outlet 122 at a lower end, a heater 123 surrounding the main pipe 12, a sprinkler 124 consisting of a plurality of nozzles and being located at a lower portion of the main pipe 12 in the center for providing cooling water required for exhaust gas treatment, and a scraper 125 which has a plurality of scraping knifes and being located at inside wall of the main pipe 12. The scraper 125 is driven by a transmission means 126 for removing lump type exhaust gas powder 20 adhering to the inside wall of the main pipe 12.

The U pipe 14 includes a pipe body 143, a first connector 141 located at one end of the pipe body 143 and connected with a bottom end of the main pipe 12, a second connector 142 located at another end of the pipe body 143, and a drain 144 located below the second connector 142.

The discharge pipe 16 has a bottom end connecting with the second connector 142, filters 161 located inside for filtering exhaust gases, and water nozzles 162 for spraying water to flush exhaust gas powder in the discharge pipe 16 to speed up exhaust gas treatment process.

Exhaust gases generated in the diffusion and deposition processes flow in the main pipe 12 through the inlet 121, and are heated by the heater 123 to form high temperature exhaust gas powders after having reacted with oxygen gas. The exhaust gas powder is then cooled by cooling water from the sprinkler 124 to form vapor and waste water which enter into the U pipe 14 through the outlet 122 and the first connector 141. Vapor continues to flow through the second connector 142 and is discharged out through the discharge pipe 16. Waste water is discharged out through the drain 144.

During exhaust gas treatment process, the inside wall of the main pipe 12 usually has exhausted gas powder deposited thereon which gradually forms lump type exhaust gas powder 20 sticking to the inside wall of the main pipe 12. This will reduce exhaust gas treatment efficiency. Therefore it needs to turn the scraper 125 to remove the lump type exhaust gas powder 20 from the inside wall of the main pipe 12 for maintaining the desired process. However the removed exhaust gas powder 20 tends to drop down in the U pipe 14 and clog the gas flow passage in the U pipe. It also impedes exhaust gas discharge operation. Hence how to improve exhaust gas treatment process is one of the ongoing R & D subjects in semiconductor industry.

SUMMARY OF THE INVENTION

The main object of this invention is to provide an exhaust gas treatment apparatus that can streamline exhaust gas discharging process without the U pipe being clogged by the lump type exhaust gas powder.

In one aspect of this invention, the apparatus includes a main pipe, an U pipe, a discharge pipe and a tank. The main pipe, U pipe and the discharge pipe are generally organized and constructed like the conventional one set forth above. However there is a tank connected with the U pipe below the first connector. The lump type exhaust gas powder after being removed from the inside wall of the main pipe wall drop down and are stored in the tank for periodical disposal. As a result, the U pipe will not clog, and the exhaust gas treatment efficiency may be maintained at a high level.

BRIEF DESCRIPTION OF THE DRAWINGS

The invention, as well as its many advantages, may be further understood by the following detailed description and drawings in which.

DETAILED DESCRIPTION OF THE PREFERRED EMBODIMENT

Figure 1:
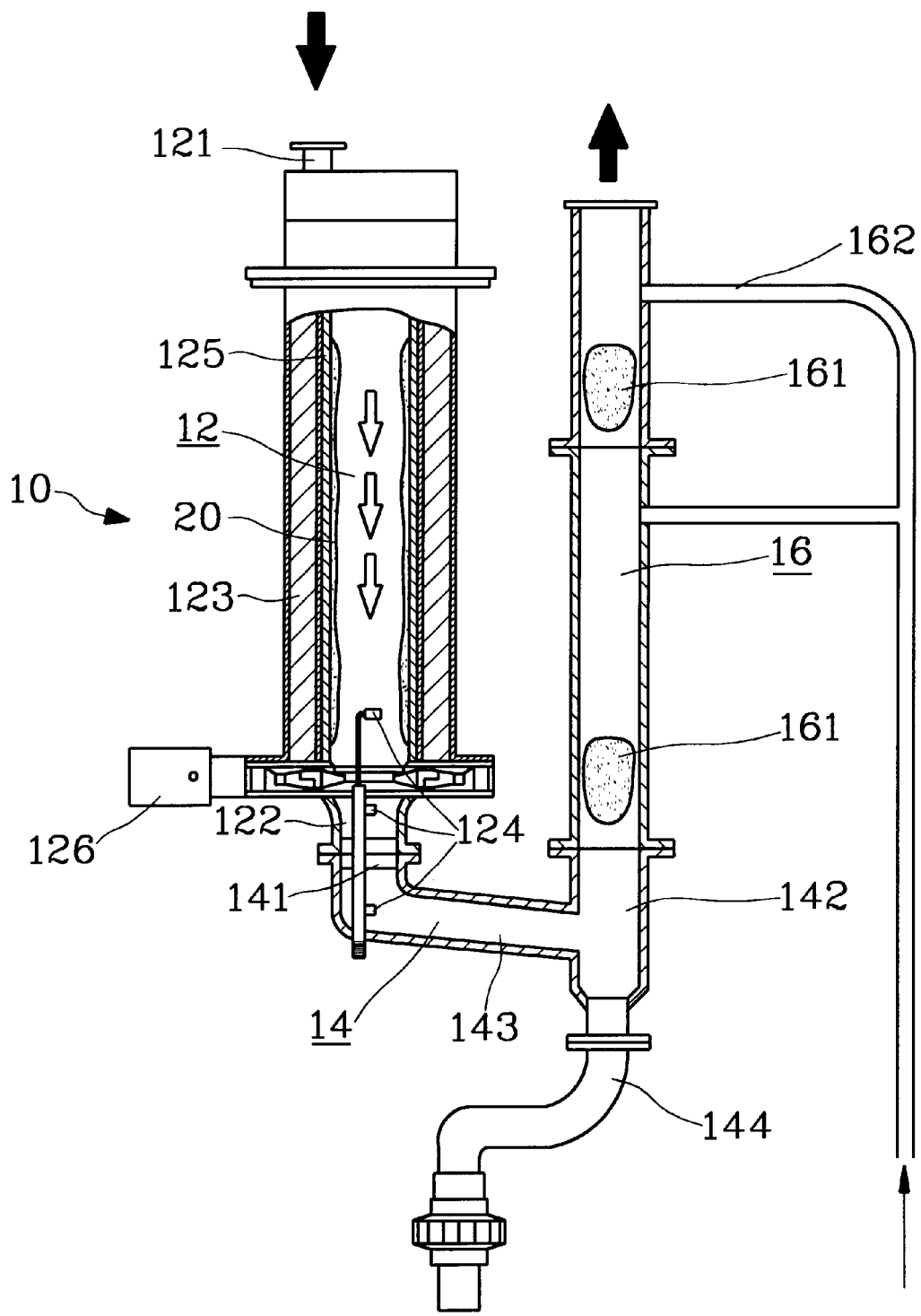
FIG. 1 is a sectional view of a conventional exhaust gas treatment apparatus.
Figure 2:
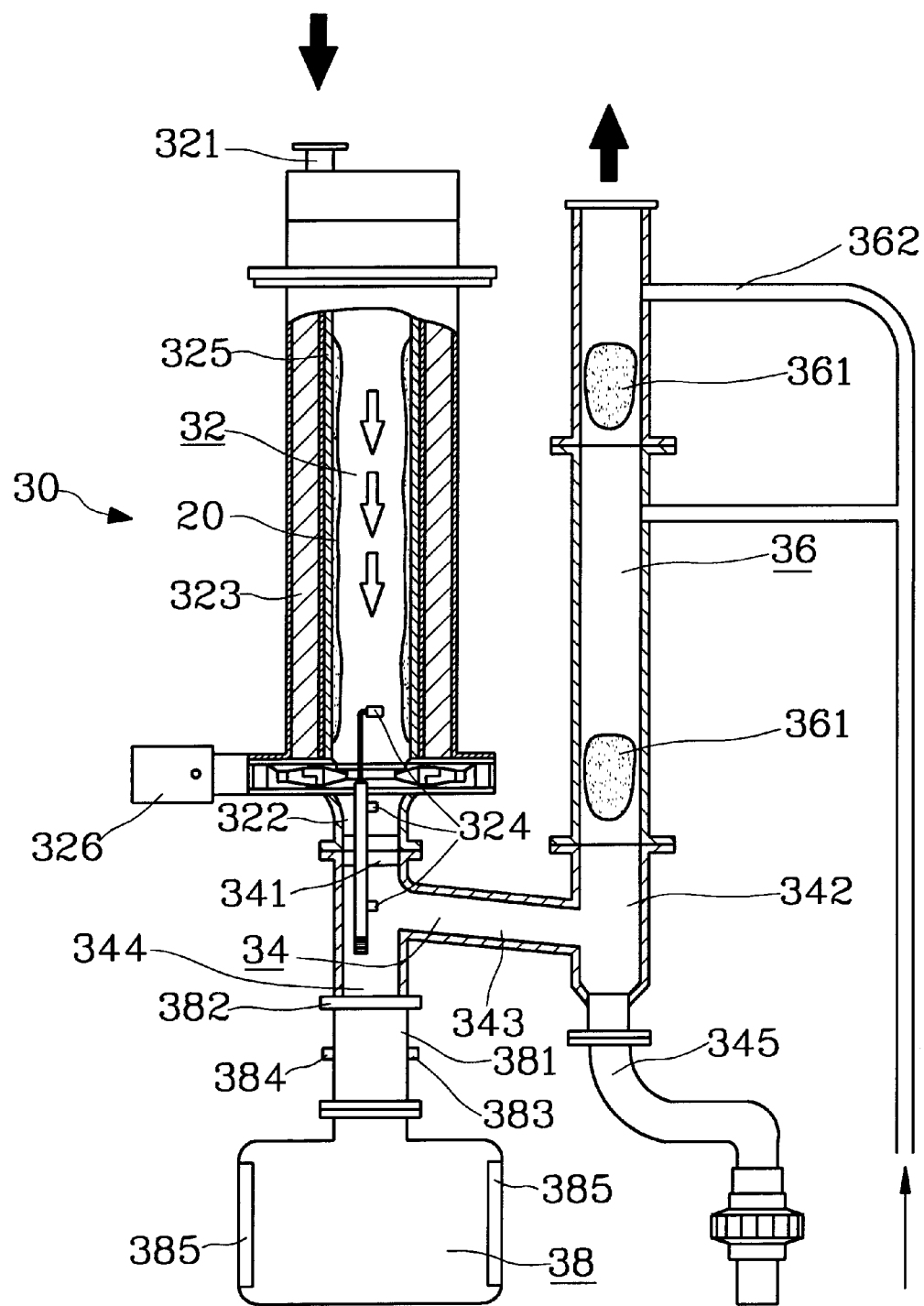
FIG. 2 is a sectional view of an exhaust gas treatment system apparatus according to one embodiment of the present invention.

Referring to FIG. 2, the exhaust gas treatment apparatus 30 according to this invention includes a main pipe 32, an U pipe 34, a discharge pipe 36 and a tank 38.

The main pipe 32 includes an inlet 321 at an upper end thereof, an outlet 322 at a lower end, a heater 323 surrounding the main pipe 32, a sprinkler 324 consisting of a plurality of nozzles and being located at a lower portion of the main pipe 32 in the center for providing cooling water required for exhaust gas treatment, and a scraper 325 which has a plurality of scraping knifes and being located at inside wall of the main pipe 32. The scraper 325 is driven by a transmission means 326 for removing lump type exhaust gas powders 20 adhered to the inside wall of the main pipe 32.

The U pipe 34 includes a pipe body 343, a first connector 341 located at one end of the pipe body 343 and connected with a bottom end of the main pipe 30, a second connector 342 located at another end of the pipe body 343, an exit 344 located below the first connector 341 and a drain 345 located below the second connector 342. Both the first and second connector 341 and 342 are opened upward.

The tank 38 connects with the exit 344 through a third connector 381 for holding lump type exhaust gas powder 20 which drops down after being removed from the inside wall of the main pipe 321. Therefore the U pipe 34 may be prevented from clogging by the removed lump type exhaust gas powder. The tank 38 further has a valve 382 in the third connector 381, a nitrogen gas inlet 383 and a gas outlet 384 below the valve 382, and transparent windows 385 on the side walls of the tank. The valve 382 may separate the U pipe 34 from the tank 38. The nitrogen gas inlet 383 may receive nitrogen gas into the tank 38 from an external nitrogen gas source for diluting toxic exhaust gas held in the tank 38, which is then discharged through the gas outlet 384. The windows 385 enable people to view the stocking level of the exhaust gas powder 20 held in the tank 38 for tank disposal or replacement.

The discharge pipe 36 has a bottom end connecting with the second connector 342, filters 361 located inside for filtering exhaust gases, and water nozzles 362 for spraying water to flush exhaust gas powder in the discharge pipe 36 to speed up exhaust gas treatment process.

Exhaust gases generated in the diffusion and deposition processes (such as SiH4, SiH2Cl2, NF3) flow in the main pipe 32 through the inlet 321, and are heated by the heater 323 to form high temperature exhaust gas powder after having reacted with oxygen gas. The exhaust gas powder is then cooled by cooling water from the sprinkler 324 to form vapor and waste water which enter into the U pipe 34 through the outlet 322 and the first connector 341. Vapor continues to flow through the second connector 342 and is discharged out through the discharge pipe 36. Waste water is discharged out through the drain 344. Some of the exhaust gas powder form lump type exhaust gas powder 20 sticking to the inside wall of the main pipe 32. The scraper 325 driven by the transmission means 326 may be turned to remove the lump type powder 20 off the inside wall of the main pipe 30. The removed powder 20 then drops down into the tank 38 without clogging the U pipe 34. When lump type exhaust gas powder 20 accumulates in the tank 38 to a predetermined level, the tank 38 should be replaced or cleaned. The windows 385 enable service people to view inside status of the tank 38 to decide when such replacement or cleaning job should be done. When it is time for the tank replacement or cleaning, the valve 382 maybe turned to close the passage between the exit 344 of the U pipe 34 and the third Before removing the tank 38, nitrogen gas may be injected into the tank 38 through the nitrogen gas inlet 383 to dilute toxic gases held in the tank 38 to an acceptable level. The diluted exhaust gases then may be discharged out through the discharge outlet 384. Then the tank 38 may be disconnected and removed for cleaning or replacement. All this may be done while the valve 382 remains closed and the exhaust gas treatment in the main pipe 32, U pipe 34 and discharge pipe 36 continues. Total exhaust gas treatment efficiency thus may be greatly improved.

In summary, this invention offers the following advantages:

a. The tank located below the U pipe may hold the dropping lump type exhaust gas powder. The U pipe thus won't be clogged. Exhaust gas may be discharged smoothly and steadily with less equipment shutdown.

b. The tank has windows to enable service people to view stocking level of exhaust gas powder in the tank, to allow for timely replacement of the tank.

c. In the connector between the tank and the U pipe, there is a valve which may be closed to stop exhaust gas flowing into the tank when tank replacement is proceeding. And exhaust gas treatment may continue without shutting down wafer processing machines while the tank replacement is proceeding. It helps to improve overall wafer production efficiency.

d. The tank has nitrogen gas inlet and discharge outlet for diluting toxic exhaust gases in the tank to a safe level so that service people have better protection.

It may thus be seen that the objects of the present invention set forth herein, as well as those made apparent form the foregoing description, are efficiently attained. While the preferred embodiment of the invention has been set forth for purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. An exhaust gas treatment apparatus for treating exhaust gases generated in diffusion and deposition processes in wafer production process, comprising:

a main pipe including an inlet for receiving the exhaust gases, a heater surrounding the main pipe for heating the exhaust gases, a scraper located in the main pipe for scraping inside wall of the main pipe, a sprinkler located in a lower portion of the main pipe in a center thereof for providing cooling water to mix with the heated exhaust gases to form vapor and waste water, and an outlet for discharging the vapor and waste water;

a U pipe having a pipe body, a first connector connecting with the outlet and a second connector which has a drain located thereunder, the first connector having an exit located thereunder;

a discharge pipe connecting with the U pipe through the second connector, and a tank connecting with the U pipe through a third connector under the exit.

2. The exhaust gas treatment apparatus of claim 1, wherein the tank has a plurality of transparent viewing windows for people to see inside of the tank.

3. The exhaust gas treatment apparatus of claim 1 further having a valve located in the third connector for separating the tank from the U pipe.

4. The exhaust gas treatment apparatus of claim 1, wherein the third connector having a nitrogen gas inlet and a discharge outlet.

5. The exhaust gas treatment apparatus of claim 1, wherein the third connector is detachable from the tank.

6. The exhaust gas treatment apparatus of claim 1, wherein the discharge pipe further has a filter located therein for filtering exhaust gas to comply with exhaust gas discharge standards.

7. The exhaust gas treatment apparatus of claim 1, wherein the discharge pipe further has a water nozzle for spraying water to flush exhaust gas powder to speed up exhaust gas treatment.

8. The exhaust gas treatment apparatus of claim 1, wherein the inside wall of the main pipe is heated up 800 C.

9. The exhaust gas treatment apparatus of claim 1, wherein heated exhaust gas powder has a portion deposited on the inside wall of the main pipe to form lumped exhaust gas powder that is deposited into the tank.

10. The exhaust gas treatment apparatus of claim 1, wherein the scraper is driven by a transmission means.

11. The exhaust gas treatment apparatus of claim 1, wherein the sprinkler includes a plurality of nozzles.

12. The exhaust gas treatment apparatus of claim 1, wherein further including cooling water that mixes with the heated exhaust gas to form vapor which is discharged out through the U pipe and the discharge pipe.

13. The exhaust gas treatment apparatus of claim 1, wherein further including cooling water that mixes with the heated exhaust gas to form waste water which is discharged out through the U pipe and the drain.

* * * * *